United States Patent
Jung et al.

(10) Patent No.: US 6,875,678 B2
(45) Date of Patent: Apr. 5, 2005

(54) POST THERMAL TREATMENT METHODS OF FORMING HIGH DIELECTRIC LAYERS IN INTEGRATED CIRCUIT DEVICES

(75) Inventors: Hyung-suk Jung, Suwon (KR); Nae-in Lee, Seoul (KR); Jong-ho Lee, Gunpo (KR); Yun-seok Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/650,415

(22) Filed: Aug. 29, 2003

(65) Prior Publication Data

US 2004/0048491 A1 Mar. 11, 2004

(30) Foreign Application Priority Data

Sep. 10, 2002 (KR) ................................ 10-2002-0054606

(51) Int. Cl.$^7$ ................. H01L 21/3205; H01L 21/4763
(52) U.S. Cl. ....................... 438/591; 438/216; 438/240; 438/261; 438/287; 438/761; 438/785
(58) Field of Search ................................ 438/183, 197, 438/199, 216, 217, 229–231, 240, 257, 261–263, 266, 287, 584, 591, 592, 761, 770, 785, 787

(56) References Cited

U.S. PATENT DOCUMENTS

| | | | |
|---|---|---|---|
| 6,251,761 B1 | * | 6/2001 | Rodder et al. .............. 438/591 |
| 6,451,641 B1 | * | 9/2002 | Halliyal et al. ............. 438/200 |
| 6,566,205 B1 | * | 5/2003 | Yu et al. ..................... 438/287 |
| 2002/0153579 A1 | * | 10/2002 | Yamamoto .................. 257/412 |
| 2003/0234417 A1 | * | 12/2003 | Raaijmakers et al. ....... 257/309 |

* cited by examiner

Primary Examiner—Asok Kumar Sarkar
(74) Attorney, Agent, or Firm—Myers Bigel Sibley & Sajovec

(57) ABSTRACT

High dielectric layers formed from layers of hafnium oxide, zirconium oxide, aluminum oxide, yttrium oxide, and/or other metal oxides and silicates disposed on silicon substrates may be nitrided and post thermally treated by oxidation, annealing, or a combination of oxidation and annealing to form high dielectric layers having superior mobility and interfacial characteristics.

29 Claims, 8 Drawing Sheets

POST THERMAL TREATMENT METHODS OF FORMING HIGH DIELECTRIC LAYERS IN INTEGRATED CIRCUIT DEVICES

CROSS-REFERENCE TO RELATED APPLICATIONS

This application claims priority to Korean Patent Application No. 2002-54606, filed on Sep. 10, 2002 in the Korean Intellectual Property Office, the disclosure of which is incorporated herein in its entirety by reference.

FIELD OF THE INVENTION

The present invention relates to methods for forming dielectric layer structures in integrated circuit devices.

BACKGROUND OF THE INVENTION

As semiconductor devices become highly integrated and the thickness of gate insulating layers becomes smaller, new materials are being developed for the gate insulating layers. Silicon oxide ($SiO_2$) layers may be used as gate insulating layers in today's semiconductor devices. Silicon oxides may be used as gate insulating layers because of their thermal stability, reliability, and ease of production. However, the dielectric constant of silicon oxide layers is about 3.9, which may pose some limitations on the ability to scale silicon oxide layers to different sized semiconductor devices. In particular, the leakage current of silicon oxide can greatly increase as the thickness of the silicon oxide layer decreases.

As an alternative to silicon oxide layers, high dielectric layers have been studied. High dielectric layers can be used in place of silicon oxide layers as gate insulating layers. When high dielectric layers are used as the gate insulating layer, leakage current can be reduced by making the high dielectric layer thicker than the silicon oxide layer while maintaining the same capacitance value. Some common substances that may be used in the formation of high dielectric layers include ($Ba_x$, $Sr_{1-x}$) $TiO_2$ (BST), $TiO_2$, $Ta_2O_5$, $Al_2O_3$, $ZrO_2$, Zr silicate, $HfO_2$, or Hf silicate.

The use of high dielectric layers as gate insulating layers, however, may have some problems. For instance, if a BST layer, a $TiO_2$ layer, or a $Ta_2O_5$ layer is directly deposited on a silicon substrate, interfacial characteristics with the silicon substrate may become poor and the leakage current may increase. In addition, interface trap charge densities may increase and the mobility may decrease. The use of aluminum oxide ($Al_2O_3$) as a high dielectric layer may provide a high thermal stability, however, aluminum oxide has a relatively low dielectric constant of about 11 and a threshold voltage that can be difficult to control.

It has also been suggested to use a zirconium oxide layer, a zirconium silicate layer, a hafnium oxide layer, or a hafnium silicate layer as high dielectric layers. Each of these compounds may have moderate thermal stability and mid level dielectric constants of about 12–25. However, zirconium oxide layers can react with polysilicon, therefore it may not be desirable to use zirconium oxide layers alone. Hafnium oxide layers can become thick and can be easily crystallized, resulting in increases in the leakage current through grain boundaries. In addition, the threshold voltages of devices including zirconium oxide layers and hafnium oxide layers can be difficult to control, making these compounds undesirable as high dielectric layers.

SUMMARY OF THE INVENTION

The present invention relates to methods for forming high dielectric layers in integrated circuit devices and treating the high dielectric layers. In particular, various embodiments of the present invention relate to methods for treating high dielectric layers of integrated circuit devices, wherein the high dielectric layers may include aluminum oxide layers, yttrium oxide layers, hafnium oxide layers, and/or zirconium oxide layers. The embodiments of the present invention provide methods for nitriding, oxidizing, and/or annealing the high dielectric layers.

The various embodiments of the present invention involve methods for treating one or more high dielectric layers of one or more integrated circuit devices. The high dielectric layers may include layers of hafnium oxide, zirconium oxide, and/or Group 3 metal oxide layers, such as aluminum oxide and yttrium oxide. For the purposes of explaining the various embodiments of the present invention, the recitations of "Group 3 metal" means and includes all metals in Group 3 of the periodic table. This includes, for example, Sc, Y, La, Ac, B, Al, Ga, In, and Tl. For instance, in various embodiments of the present invention a high dielectric layer may include a nano laminate that includes a hafnium oxide layer or a zirconium oxide layer and a Group 3 metal oxide layer.

In various embodiments of the present invention, a method for treating one or more high dielectric layers of one or more integrated circuit devices involves the nitriding of a silicon substrate upon which the high dielectric layer is formed. The nitriding of the substrate may be performed, for example, by using a nitrogen plasma treatment, a thermal treatment in a nitrogen atmosphere, or a thermal treatment of a nitrogen layer formed on the substrate. Following nitriding, the silicon substrate and high dielectric layer are post treated by oxidizing the substrate to which the nitriding was applied, annealing the substrate to which the nitriding was applied, or by both oxidizing and annealing the substrate to which the nitriding was applied.

In certain embodiments of the present invention, the post treatment of a silicon substrate and high dielectric layer involves the annealing of the nitrided silicon substrate and high dielectric layer. The post treatment anneal may be performed in an atmosphere of inert gas or gases, heavy hydrogen, hydrogen, mixtures of nitrogen and hydrogen gas, or in a vacuum. The post treatment anneal following nitriding may be performed at temperatures at or between about 750° C. and about 1100° C.

In other embodiments of the present invention, the post treatment of a nitrided silicon substrate and high dielectric layer involves oxidizing the silicon substrate and high dielectric layer to which the nitriding was applied. The post treatment oxidizing may be performed using wet or dry oxidizing techniques to oxidize the silicon substrate where the high dielectric layer is formed. Oxidization of the silicone substrate and high dielectric layer may be performed with ozone, radical oxygen, and/or oxygen plasma. The oxidizing may be performed at or between temperatures of about 700° C. to about 900° C. in some embodiments.

Other embodiments of the present invention involve the post treatment oxidization of the silicon substrate and high dielectric layer to which nitriding was applied, followed by the annealing of the nitrided and oxidized silicon substrate and high dielectric layer. The oxidization may be performed using ozone, radical oxygen, and/or oxygen plasma, and may be carried out at or between temperatures of about 700° C. to about 900° C. The annealing process may be performed at or between temperatures of about 950° C. to about 1100° C.

BRIEF DESCRIPTION OF THE DRAWINGS

The invention can be more readily ascertained from the following description of the invention when read in conjunction with the accompanying drawings in which.

DETAILED DESCRIPTION OF EMBODIMENTS ACCORDING TO THE INVENTION

Figure 1:
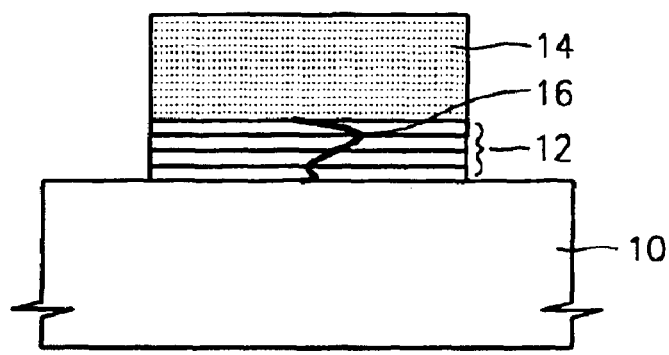
FIG. 1 illustrates a schematic diagram of a semiconductor device to which the present invention may be applied.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or "onto" another element, it can be directly on the other element or intervening elements may also be present. When an element such as a layer, region or substrate is referred to as being "directly on" another element, it is in direct contact with that other element.

FIG. 1 illustrates a schematic diagram of a semiconductor device and high dielectric layer that may be used with, or may be formed according to, various embodiments of the present invention. The semiconductor device includes a silicon substrate 10 and a high dielectric layer 12 overlying the silicon substrate 10. In some embodiments, the semiconductor device may also include a polysilicon layer 14 formed over the high dielectric layer 12. Arsenic (As) may be implanted into the nMOS (n-channel metal oxide semiconductor) regions of the semiconductor device and boron (B) may be implanted into the pMOS (p-channel metal oxide semiconductor) regions of the semiconductor device. Although various embodiments of the present invention may be described with reference to semiconductor devices, it is understood that the embodiments of the invention apply to integrated circuits devices.

The methods and processes of various embodiments of the present invention may be applied to silicon substrates 10 having high dielectric layers 12 already formed thereon. In other embodiments, it may be desirable to form the high dielectric layer 12 from particular compositions in order to control or modify the electrical and physical characteristics of the high dielectric layers 12.

For example, it may be desirable to form at least a portion of the high dielectric layer 12 from aluminum oxide. As compared to silicon oxide layers, the flatband voltage of aluminum oxide layers is to the right of the silicon oxide layers on a capacitance-voltage plot. This indicates that the aluminum oxide layer exhibits a negative fixed charge. Aluminum oxide layers also exhibit superior thermal stability when compared to other materials used to form high dielectric layers. However, the dielectric constant of aluminum is about 11, which is not high in comparison with other high dielectric layers 12.

Other compositions may also be used to form at least a portion of the high dielectric layer 12. For instance, hafnium oxide layers and/or zirconium oxide layers may be used. The flatband voltage of hafnium oxide layers and zirconium oxide layers on a capacitance-voltage plot is to the left of that of a silicon oxide layer. This indicates that hafnium oxide layers and zirconium oxide layers have a positive fixed charge. Hafnium oxide layers and zirconium oxide layers also exhibit relatively high dielectric constants, with values between about 12 and 25. In addition, the thermal stability of hafnium and zirconium oxide layers is superior to other layers used as high dielectric layers 12. Hafnium oxide layers, as appreciated by the inventors, can be easily crystallized, which can increase leakage current, making their sole use as high dielectric layers 12 less desirable. Similarly, the inventors also appreciate that zirconium oxide layers used alone can increase current leakage because they may tend to react with polysilicon layers overlying the high dielectric layers 12 in a semiconductor device.

According to some embodiments of the present invention, nano laminates formed by depositing aluminum oxide layers followed by hafnium oxide layers and/or zirconium oxide layers may be used as high dielectric layers 12. In other embodiments, high dielectric layers 12 may include nano laminates formed by depositing hafnium oxide layers and/or zirconium oxide layers followed by aluminum oxide layers. In still other embodiments, the aluminum oxide layers may be replaced by a layer of a Group 3 metal oxide. For instance, yttrium oxide layers may be used in place of the aluminum oxide layers. In either case, the combination of Group 3 metal oxide layers and hafnium oxide layers and/or zirconium oxide layers in the nano laminate takes advantage of the electrical and physical characteristics offered by each composition.

For instance, in certain embodiments of the present invention a nano laminate is formed as the high dielectric layer 12. The nano laminate may be formed by depositing in turn a hafnium oxide layer and/or a zirconium oxide layer and a Group 3 metal oxide layer, such as aluminum oxide, on a silicon substrate 10. In other embodiments, the nano laminate may be formed by depositing in turn a Group 3 metal oxide, such as aluminum oxide or yttrium oxide, and a hafnium oxide or zirconium oxide layer. Nano laminates formed according to embodiments of the present invention form the high dielectric layer 12. The various layers of the nano laminate may be applied to the silicon substrate using atomic layer deposition. The thickness of the nano laminate layers may be adjusted in accordance with known methods of atomic layer deposition.

Silicates may also be used to form the nano laminates of the present invention and may be deposited alone or in conjunction with oxide layers. Silicates such as hafnium silicate, zirconium silicate, and/or aluminum silicate have dielectric constants of 10 to 12 and are stable in silicon substrates. Silicate materials such as hafnium silicate and zirconium silicate also remain amorphous under thermal budgets of about 900° C. and provide superior interfacial characteristics when used as gate insulating layers.

The formation of nano laminates as high dielectric layers 12 does not solve all of the problems associated with high dielectric layers 12. In order to help overcome some of the associated problems, the treatment methods of the present invention may be applied to silicon substrates 10 and high dielectric layers 12.

According to various embodiments of the present invention, silicon substrates 10 and high dielectric layers 12 may be treated before a polysilicon layer 14 is formed on the semiconductor device. Implantation of arsenic and boron into the nMOS region and pMOS region respectively is followed by an activation anneal. The activation anneal produces a lower electrode, which is the silicon layer 10, and an upper electrode, which is the polysilicon layer 14. The characteristics of the high dielectric layer 12 may be determined and evaluated for use as a gate insulating layer. It is also possible to apply the high dielectric layer 12 to a capacitor insulating layer of a semiconductor device or to an insulating layer between a floating gate and a control gate of a non-volatile device.

The treatment of high dielectric layers 12 according to various embodiments of the present invention involves the nitriding of the high dielectric layer 12 and silicon substrate 10, followed by a post treatment. The post treatment may include annealing, oxidation treating, or both oxidation treating and annealing the high dielectric layer 12 and silicon substrate 10.

Figure 2:
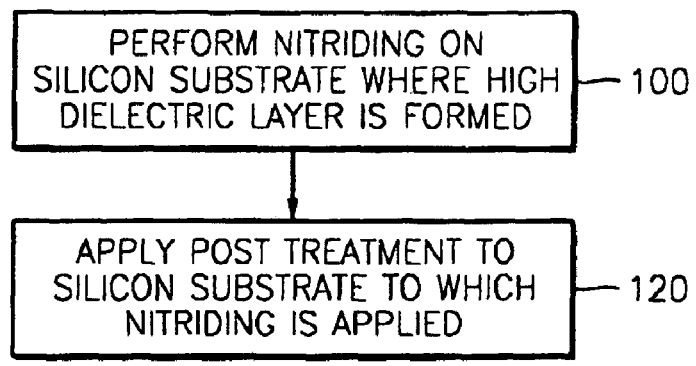
FIGS. 2–5 are flowcharts illustrating methods for post thermally treating a high dielectric layer of a semiconductor device according to embodiments of the present invention.

FIG. 2 illustrates a flowchart of a method of treating a high dielectric layer 12 of a semiconductor device according to embodiments of the present invention. More specifically, in step 100, a nitriding treatment is applied to the silicon substrate 10. The nitriding treatment may be performed using nitrogen plasma treatments, thermal treatments in a nitrogen atmosphere, or by forming a nitride layer on the high dielectric layer 12 and then performing a post treatment. Other methods for nitriding substrates may also be employed. When the nitriding is accomplished using a nitrogen plasma treatment, the nitrogen plasma treatment is performed using decoupled plasma and a remote plasma or an ammonia plasma. In those instances where a post treatment in a nitrogen atmosphere is used, the nitrogen atmosphere may include an ammonia ($NH_3$) or a nitric oxide ($N_2O$ or NO) atmosphere.

The nitriding treatment is applied to prevent boron included in the upper electrode of the polysilicon from penetrating into the high dielectric layer 12 through the grain boundary due to crystallization of the high dielectric layer 12. Boron mobility may be degraded if nitrogen exists at an interface of the polly-silicon and the high dielectric layer 12 due to the nitriding treatment. Therefore, a nitrogen profile as illustrated can provide an amount of nitrogen in an upper portion of the high dielectric layer, i.e., adjacent to or between the high dielectric layer 12 and the upper electrode of the polysilicon, and a lesser amount of nitrogen in the silicon substrate, to reduce the amount of boron that may penetrate into the nigh dielectric layer 12. The nitrogen profile can be adjusted by varying the thickness of the high dielectric layer 12, for example by profile designator 16 in FIG. 1, while maintaining the same capacitance.

In step 120, a post treatment is applied to the silicon substrate 10 to which the nitriding was applied. The post treatment is performed to reduce leakage current increases caused by an increase of trap sites after the nitriding. The post treatment is performed by annealing or by oxidation treating the silicon substrate 10 on which the high dielectic layer 12 is formed. A high dielectric layer 12 subject to the post treatments according to the present invention may exhibit superior quality, robust interfacial characteristics, and improved mobility.

The high dielectric layer 12 subject to the post thermal treatments illustrated in FIG. 2 may be formed of a nano laminate by depositing in turn a hafnium oxide layer (or a zirconium oxide layer) and a Group 3 metal oxide layer, such as an aluminum oxide layer or a yttrium oxide layer.

Figure 3:
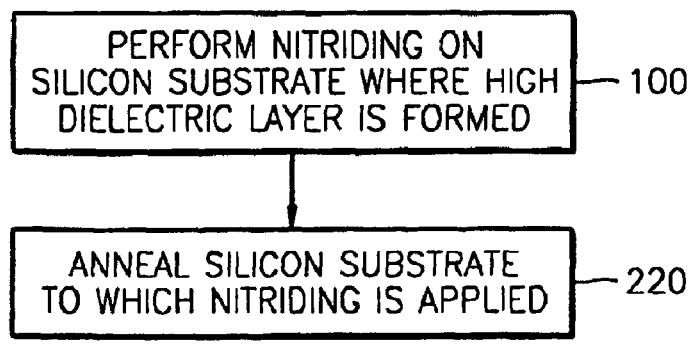

FIG. 3 illustrates a flowchart of methods for treating a high dielectric layer of a semiconductor device according to other embodiments of the present invention. In step 100, nitriding is applied to the silicon substrate 10, where the high dielectric layer 12 is formed of a nano laminate including a hafnium oxide layer (or a zirconium oxide layer) and a Group 3 metal oxide layer (such as an aluminum oxide layer). The nano laminate may be formed according to embodiments of the present invention prior to nitriding. The methods and effects of the nitriding treatment are the same as described with respect to the embodiments illustrated by FIG. 2.

In step 220, annealing is applied to the silicon substrate to which nitriding was applied. The annealing is performed in the atmosphere of an inert gas, heavy hydrogen, hydrogen, a mixed gas of nitrogen and hydrogen, or in a vacuum. The annealing is performed at or between temperatures of about 950° C. to about 1100° C. Annealing at such temperatures provides a densification effect and a robust interfacial layer. The annealing can also reduce defects that may occur as a result of the deposition of at least two metal oxide layers. A high dielectric layer 12 formed according to the methods of the present invention can have superior quality, robust interfacial characteristics, and improved mobility.

Figure 4:
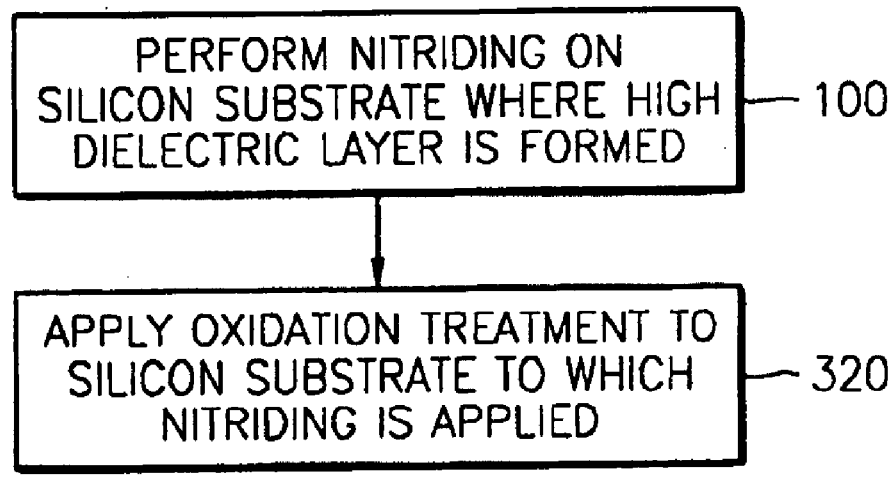

FIG. 4 illustrates a flowchart of methods for treating a high dielectric layer of a semiconductor device according to additional embodiments of the present invention. Specifically, in step 100, nitriding is applied to the silicon substrate 10, where the high dielectric layer 12 is formed of a nano laminate including a hafnium oxide layer (or a zirconium oxide layer) and a Group 3 metal oxide layer (such as an aluminium oxide layer). The methods of nitriding the silicon substrate 10 and high dielectric layer 12 and the effects of the nitriding treatment are the same as those described with respect to the embodiments illustrated by FIG. 2.

An oxidation treatment is applied to the silicon substrate 10 in step 320. The oxidation treatment can be performed using either a wet or a dry oxidation of the silicon substrate 10 and high dielectric layer 12. If wet oxidation is performed, it may be performed using $H_2O$, ISSG (In-Situ Steam Generation) or WVG (water vapor generation). In dry oxidation processes, the silicon substrate 10 and the high dielectric layer 12 are oxidized in an atmosphere of nitric oxide ($N_2O$ or NO) or oxygen. In addition, the oxidation treatment can be performed by oxidizing the silicon substrate 10 and the high dielectric layer 12 with ozone, radical oxygen, or oxygen plasma. High dielectric layers 12 formed according to these methods of the present invention can have superior quality, robust interfacial characteristics, and improved mobility. For example, the oxidation treatment may cure defects by removing trap sites such as oxygen vacancy in the high dielectric layer 12, and satisfy the stoichiometry of the metal oxide layers.

Figure 5:
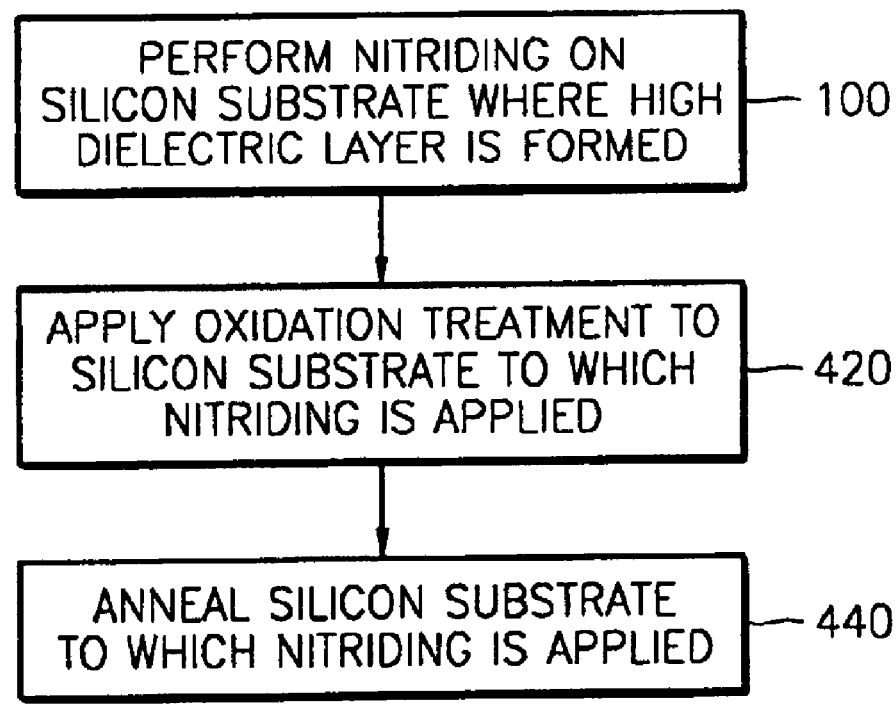

Other embodiments of the present invention use both an oxidation treatment and annealing for the post treatment of the silicon substrate 10 and high dielectric layer 12. FIG. 5 illustrates a flowchart of the methods for treating a high dielectric layer of a semiconductor device according to such embodiments of the present invention.

Nitriding is applied to a silicon substrate 10 and high dielectric layer 12 in step 100 using the same methods and processes as in other embodiments of the invention. The high dielectric layer 12 may include hafnium oxide or zirconium oxide and a Group 3 metal oxide such as an aluminum oxide or yttrium oxide.

An oxidation treatment is applied to the silicon substrate 10 and high dielectric layer 12 in step 420. The oxidation treatment can be performed using either a wet or a dry oxidation of the silicon substrate 10 and high dielectric layer 12. If wet oxidation is performed, it may be performed using $H_2O$, ISSG (In-Situ Steam Generation) or WVG (water vapor generation). In dry oxidation processes, the silicon substrate 10 and the high dielectric layer 12 are oxidized in an atmosphere of nitric oxide ($N_2O$ or NO) or oxygen. In addition, the oxidation treatment can be performed by oxidizing the silicon substrate 10 and the high dielectric layer 12 with ozone, radical oxygen, or oxygen plasma. The oxidation treatment may be at or between temperatures of about 700° C. to about 900° C.

The oxidation treatment is followed by an annealing treatment in step 440. The silicon substrate 10 and high dielectric layer 12 to which the nitriding and oxidation have been applied is annealed. The annealing is performed in the atmosphere of an inert gas, heavy hydrogen, hydrogen, a mixed gas of nitrogen and hydrogen, or in a vacuum. The annealing is performed at or between temperatures of about 950° C. to about 1100° C. High dielectric layers 12 formed according to these embodiments of the present invention can have superiour quality, robust interfacial characteristics, and improved mobility.

The electrical characteristics of a semiconductor device formed according to embodiments of the present invention are analyzed with respect to the electrical characteristics of a semiconductor device formed by rapid thermal anneal without a nitriding process. Two semiconductor samples were formed. In each sample, a high dielectric layer 12 was formed according to embodiments of the present invention. The high dielectric layers 12 comprised, for example, nano laminates including hafnium oxides or zirconium oxides and aluminum oxides or yttrium oxides.

In a first sample, a high dielectric layer 12 having a thickness of 50 Å was formed on a silicon substrate using atomic layer deposition. Rapid thermal annealing was applied to the high dielectric layer at a temperature of 950° C. for 30 seconds in a nitrogen atmosphere. The annealing formed a rapid thermal anneal (RTA) sample.

In a second sample, a high dielectric layer 12 having a thickness of 50 Å was formed on a silicon substrate using atomic layer deposition according to embodiments of the present invention. A nitriding was applied to the high dielectric layer 12 and silicon substrate 10 at a temperature of 750° C. for 60 seconds in an ammonia atmosphere. Having been subjected to nitriding, the high dielectric layer 12 and silicon substrate 10 were subject to an oxidation treatment according to embodiments of the present invention. The oxidation treatment was applied at a temperature of 850° C. for 30 seconds in an oxygen atmosphere. The high dielectric layer 12 and silicon substrate were then annealed at a temperature of 950° C. for 30 seconds in a nitrogen atmosphere. This sample is labeled RTNOA to designate it as the sample that underwent rapid thermal nitriding oxidation annealing according to embodiments of the present invention.

A polysilicon layer 14 was then applied to both the RTA and RTNOA samples. In addition, arsenic was implanted into the NMOS regions and boron was implanted into the pMOS regions after the deposition of the polysilicon layers 14. Activation annealing was applied to both samples at temperatures of 1000° C. and 1025° C. following implantation.

The electrical characteristics of the high dielectric layer processed using the treatment methods of the present invention are evaluated by testing the RTNOA sample and comparing the results of the tests to the results of similar tests on the RTA sample. The characteristics of the high dielectric layer where the annealing or oxidation treatment is optionally performed after the nitriding is applied, as described with respect to FIGS. 2–4, are not significantly different from the characteristics of the high dielectric layer in the RTNOA sample.

Figure 6A:
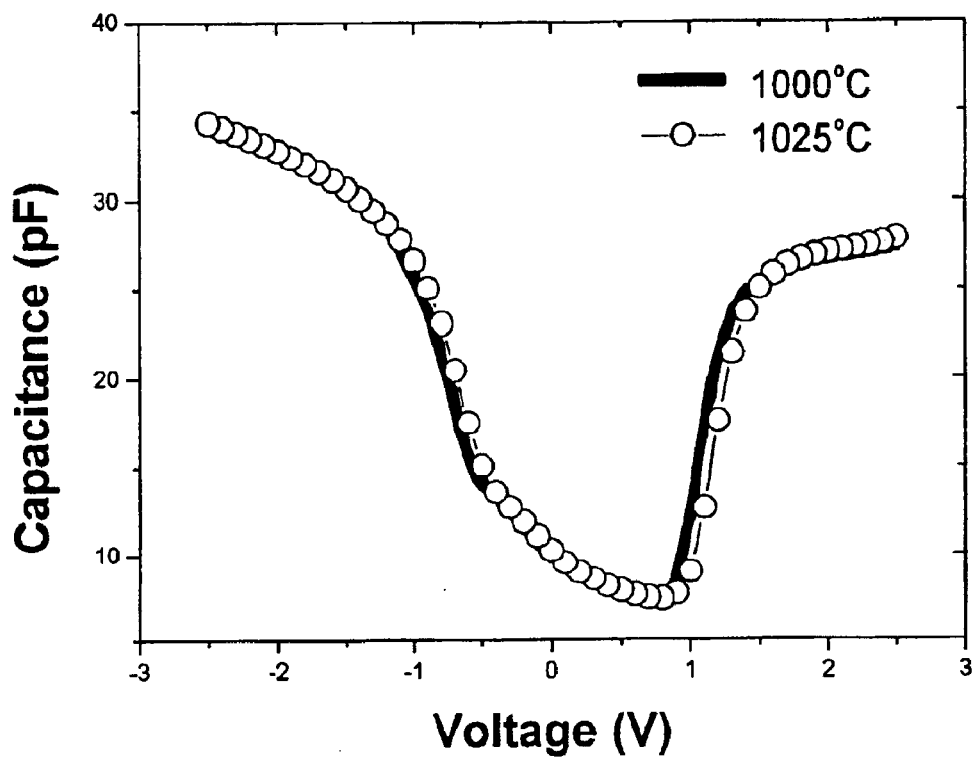
FIGS. 6A and 6B are graphs illustrating C-V curves of NMOS (n-channel metal oxide semiconductor) structures and pMOS (p-channel metal oxide semiconductor) structures for a Rapid Thermal Anneal (RTA) sample.
Figure 6B:
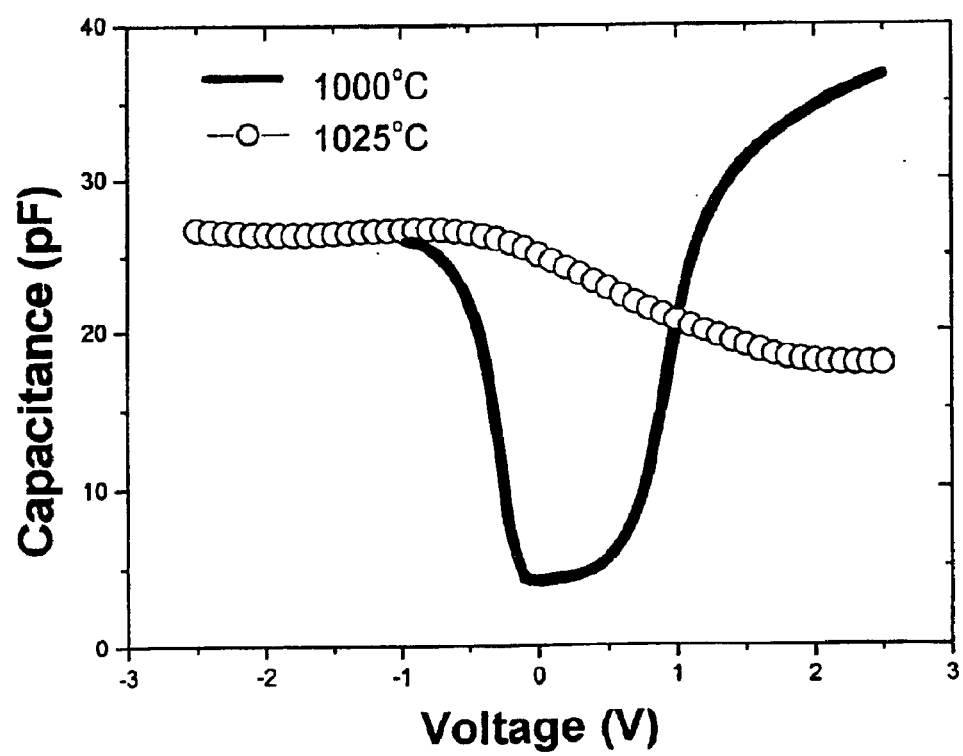

FIGS. 6A and 6B illustrate graphs showing Capacitance-Voltage (C-V) curves of nMOS and pMOS regions, respectively, for an RTA sample. Specifically, as shown in FIG. 6A, the C-V curves are not significantly different from each other for the two activation temperatures in the nMOS region. However, as shown in FIG. 6B, the RTA sample annealed at the temperature of 1000° C. presents a normal C-V curve whereas the RTA sample annealed at the temperature of 1025° C. presents an abnormal C-V curve with respect to the pMOS region. The abnormal C-V curve for the pMOS region occurs due to the degradation of interfacial characteristics by severe infiltration of boron.

Figure 7:
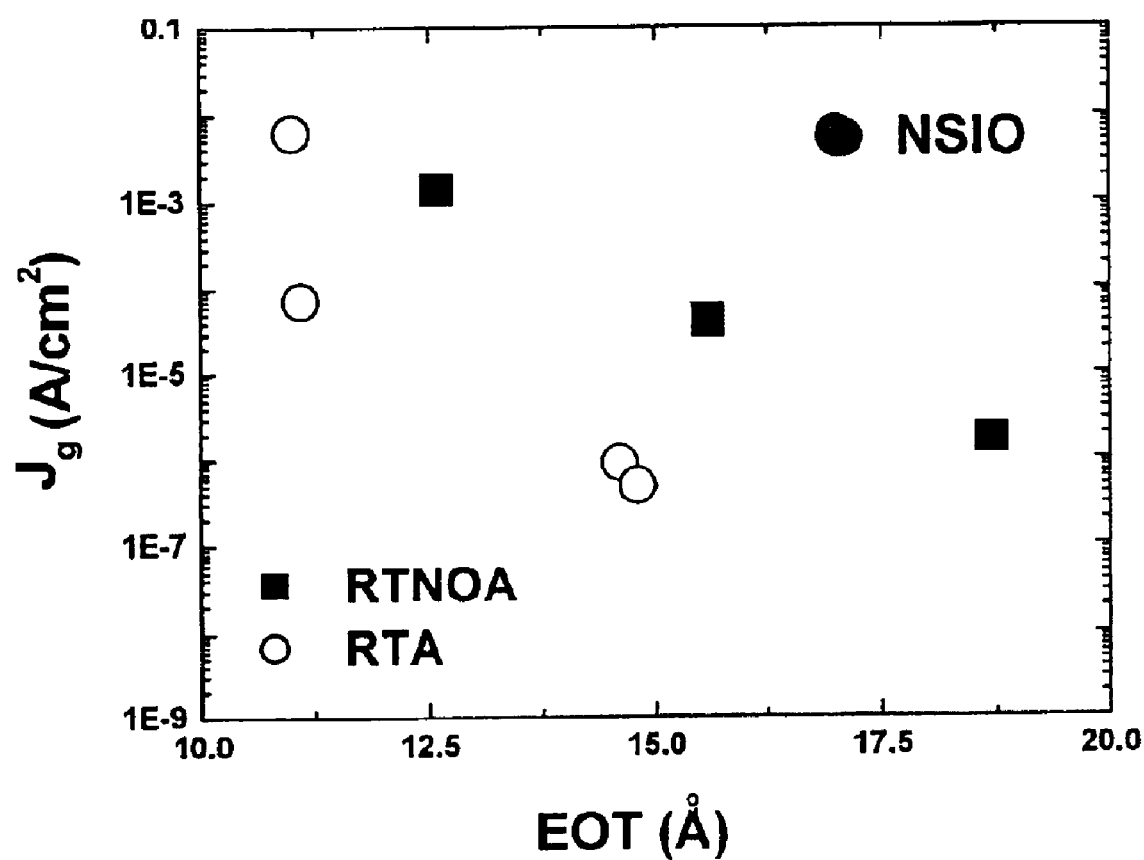
FIG. 7 is a graph illustrating the relationship between leakage current and an equivalent oxide thickness (EOT) for a Rapid Thermal Nitride Oxide Anneal (RTNOA) sample and an RTA sample.

FIG. 7 illustrates a graph showing the relationship between leakage current and an equivalent oxide thickness (EOT) for the RTNOA sample and the RTA sample. The x-axis denotes equivalent oxide thickness (EOT), and the y-axis denotes a leakage current at 1.5V. FIG. 7 specifically illustrates the relationship between the leakage current of the NMOS accumulation region at 1.5V and EOT values for the RTNOA and RTA samples. For the same leakage current, the RTA and RTNOA samples have smaller EOT values, smaller by 4 to 5 Å, than an NSiO sample where the silicon oxide layer is formed as the gate insulating layer and then the nitriding is applied. In addition, the RTA sample has a smaller EOT value than the RTNOA sample for the same leakage current. However, it is not certain that the RTA sample has superior characteristics to the RTNOA sample in terms of scalability because pMOS characteristics are not present in the RTA sample, which is thinner than 40 Å, due to the penetration of boron.

Figure 8A:
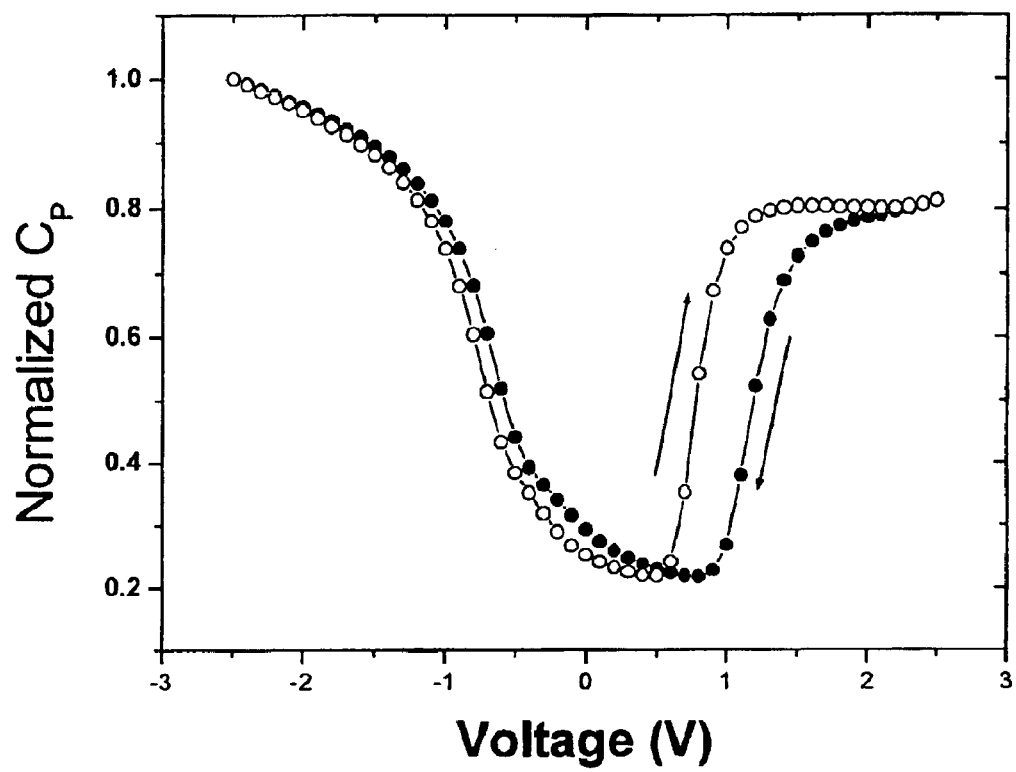
FIGS. 8A and 8B are graphs illustrating C-V curves of nMOS structures and pMOS structures for an RTA sample.
Figure 8B:
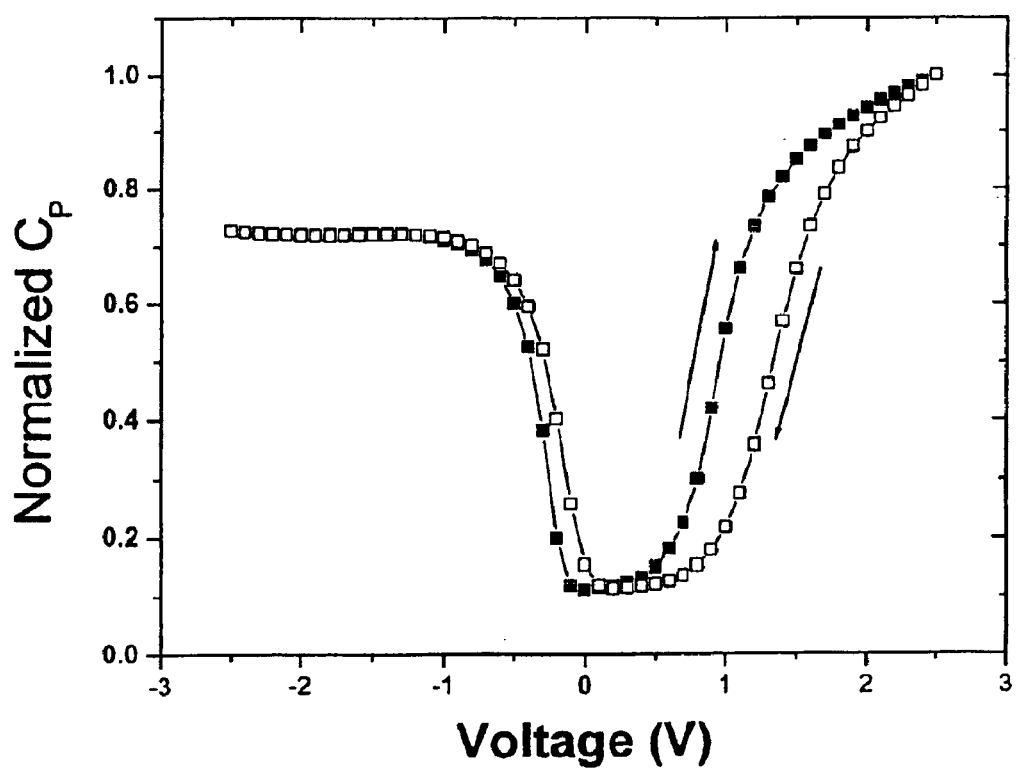
Figure 9A:
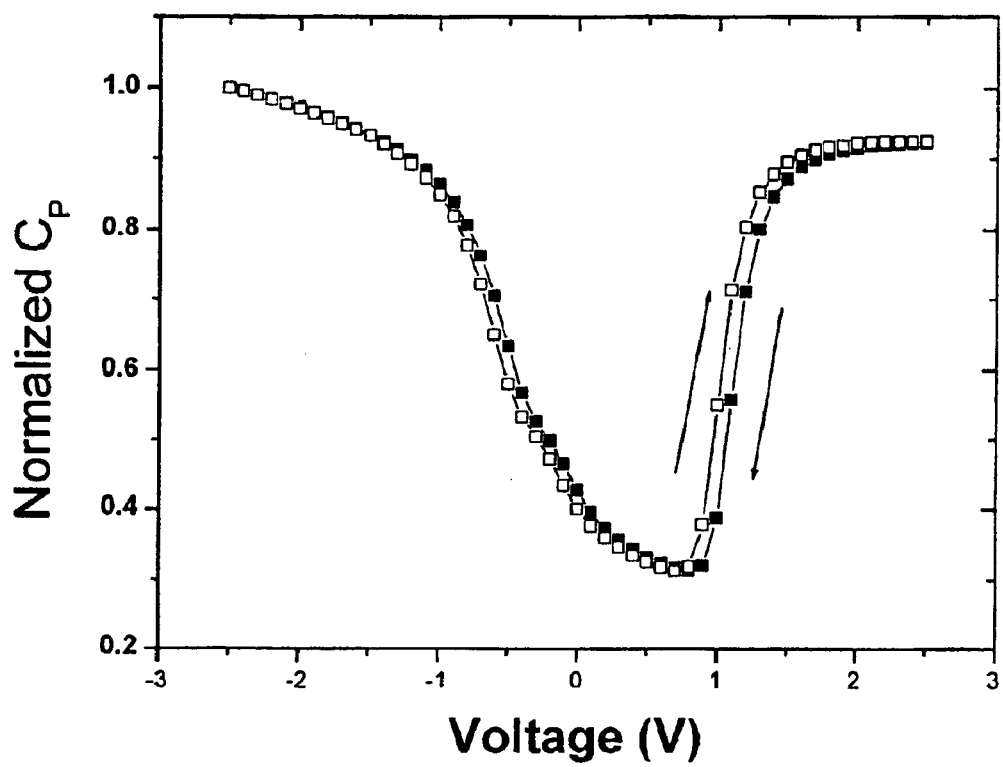
FIGS. 9A and 9B are graphs illustrating C-V curves of NMOS structures and pMOS structures for an RTNOA sample.
Figure 9B:
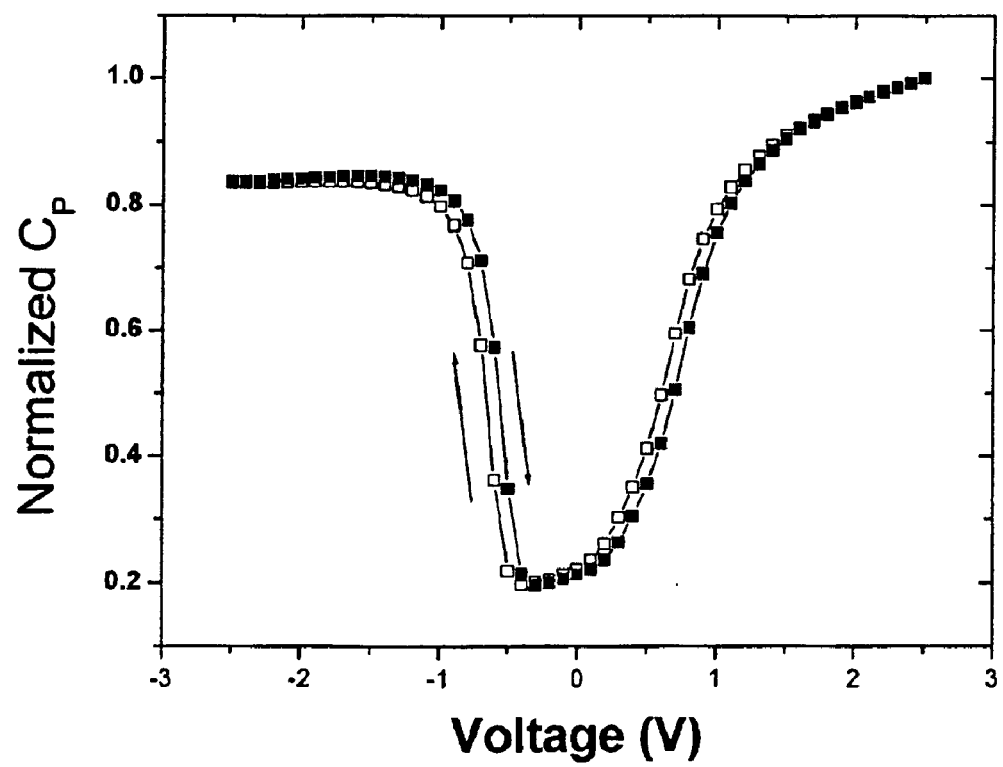

FIGS. 8A and 8B illustrate graphs showing C-V curves of nMOS and pMOS regions, respectively, for the RTA sample. FIGS. 9A and 9B illustrate graphs showing C-V curves of NMOS and pMOS regions for the RTNOA sample, respectively. The y-axis of FIGS. 8A, 8B, 9A and 9B denotes normalized capacitances.

In the RTA sample shown in FIGS. 8A and 8B, the width between the C-V hysteresis curves is large, i.e., 0.37V or 0.39V. On the other hand, the width between C-V hysteresis curves of the RTNOA sample shown in FIGS. 9A and 9B is less than 0.1V. This demonstrates that the interfacial characteristics of the RTNOA sample are superior to the interfacial characteristics of the RTA sample.

Figure 10A:
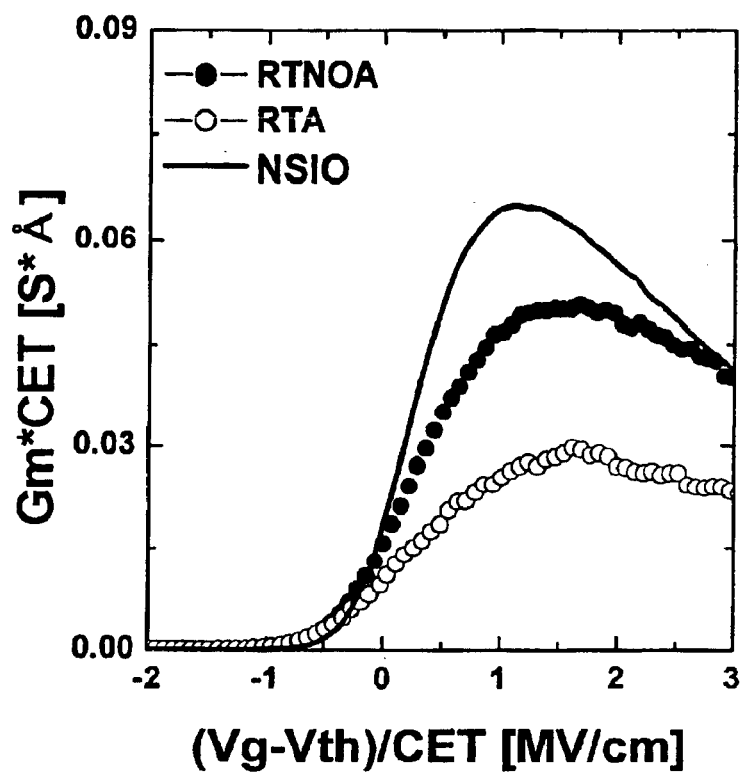
FIGS. 10A and 10B are graphs illustrating transconductance values with respect to the electric fields of nMOS structures and pMOS structures for an RTA sample and an RTNOA sample.
Figure 10B:
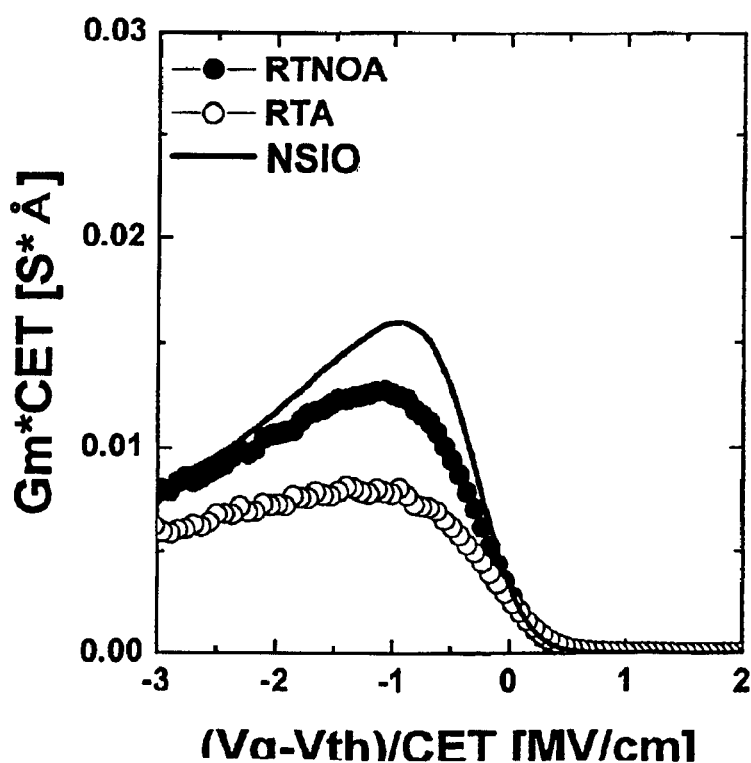

FIGS. 10A and 10B illustrate graphs showing transconductance (Gm) values with respect to the electronic fields of NMOS and pMOS regions, respectively, for the RTA sample and the RTNOA sample. In FIGS. 10A and 10B, CET denotes capacitance measured equivalent oxide thickness, Vg denotes gate voltage, and Vth denotes threshold voltage. The width W and length L of the pMOS and NMOS regions are 10 μm and 0.1 μm, respectively.

Transconductance (Gm) is evaluated to observe the mobility characteristics of the samples. Gm is illustrated based on a NSiO sample where an oxide layer to which the nitriding is applied is used as a dielectric layer for comparison. In the RTA sample, Gm in nMOS regions corresponds to 45% in comparison with an NSIO sample using the nitriding oxide layer as the dielectric layer and corresponds to 51% in comparison with an NSIO sample. As a result of this, mobility is highly decreased. On the other hand, in the RTNOA sample, Gm in nMOS regions corresponds to 78% in comparison to an NSIO sample and GM in pMOS regions corresponds to 79% in comparison with an NSIO sample. Therefore, the mobility of RTNOA sample does not highly decrease in comparison with the RTA sample.

Figure 11A:
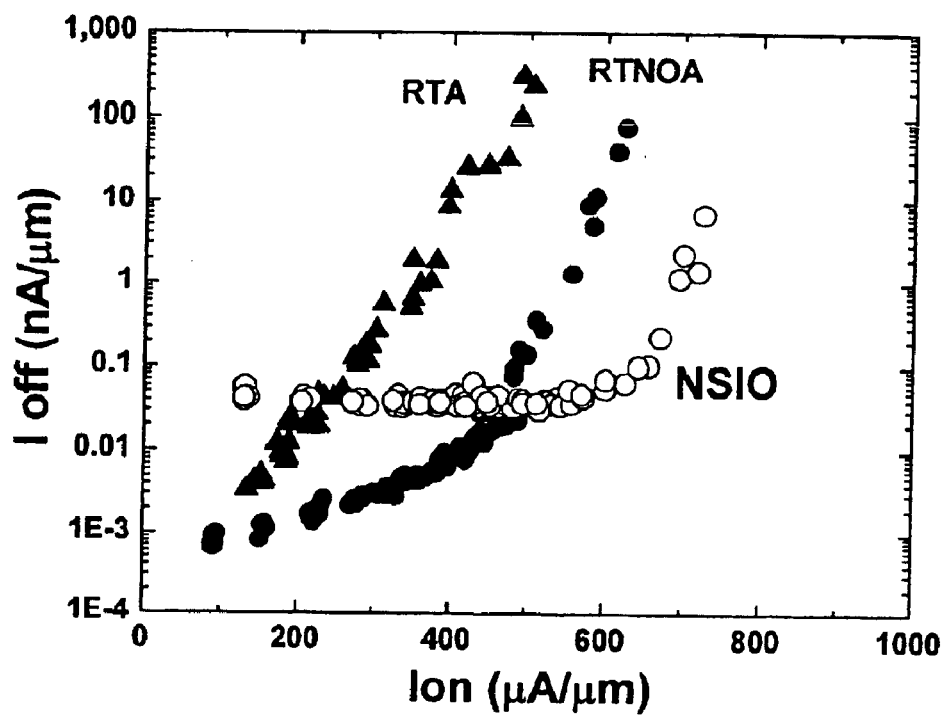
FIGS. 11A and 11B are graphs illustrating the current in an on-state (Ion) and the current in an off-state (Ioff) of the nMOS structures and the pMOS structures for an RTA and an RTNOA sample.
Figure 11B:
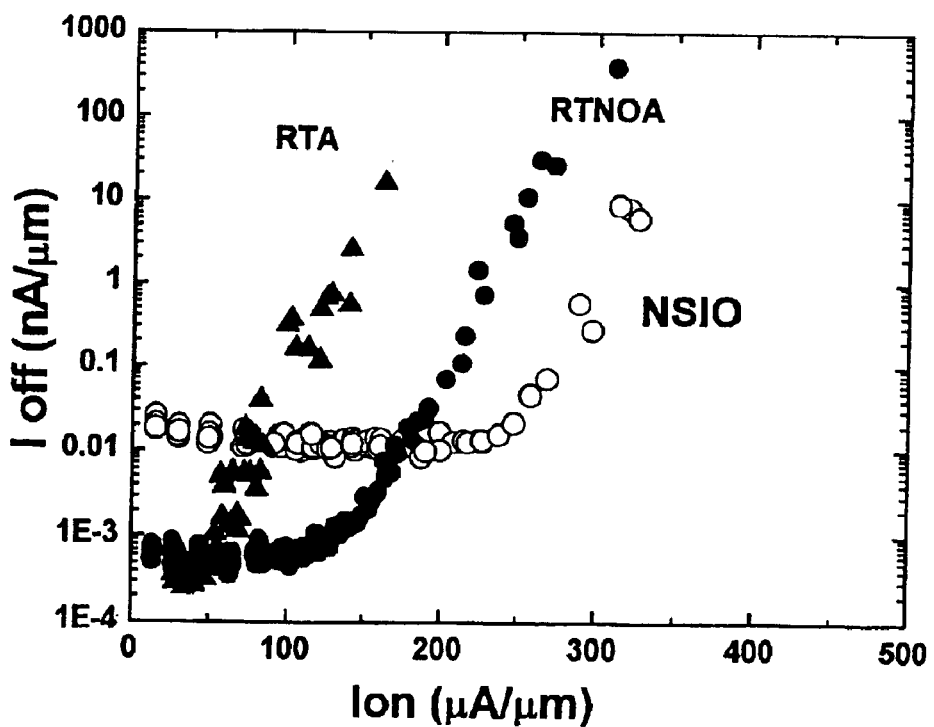

FIGS. 11A and 11B illustrate graphs of current in an on-state (Ion) and current in an off-state (Ioff) of the NMOS and the pMOS regions, respectively, for the RTA and RTNOA samples. The drain voltage Vdd is set to 1.2V. As shown in FIGS. 11A and 11B, the current in an on-state (or drive current) for the RTA sample of nMOS and pMOS regions corresponds to 52% and to 50%, respectively, of the current in an off-state, i.e., 10 nA, as compared to the NSIO sample. On the other hand, the current in the on-state for the RTNOA sample in NMOS and pMOS regions corresponds to 81% and to 80%, respectively, of the current in an off-state, i.e., 10 nA, as compared to the NSiO sample.

Table 1 summarizes some of the electrical characteristics of the RTA and RTNOA samples.

TABLE 1

| | | Result | | | | | |
|---|---|---|---|---|---|---|---|
| Condition | | CET (Accumulation) | CET (Inversion) | Gate depletion | Width of hysteresis curve | Gm ratio to normalized sample | On current ratio to normalized sample |
| RTA sample | nMOS | 22.7 | 26.8 | 83.9% | 0.37 | 45% | 52% |
| | pMOS | 20.9 | 30.6 | 68.3% | 0.39 | 51% | 50% |
| RTNOA sample | nMOS | 24.0 | 28.1 | 85.4% | >0.1 | 78% | 81% |
| | pMOS | 23.3 | 32.5 | 71.7% | >0.1 | 79% | 80% |

As shown in Table 1, the capacitance measured equivalent oxide thickness CETs of the NMOS and pMOS regions of the RTA sample are 22.7 Å and 20.9 Å, respectively, in the accumulation region and 26.8 Å and 30.6 Å, respectively, in the inversion region. On the other hand, in the RTNOA sample, the capacitance measured equivalent oxide thickness CETs of the nMOS and pMOS regions are 24.0 Å and 23.3 Å, respectively, in the accumulation region, and 28.1 Å and 32.5 Å, respectively, in the inversion region. Therefore, the RTNOA sample has relatively large CET values. However, the RTNOA sample has some margins in the leakage current, and the CET values can be reduced by adjusting the amount of oxidation used with the post thermal treatment. As to gate depletion, the nMOS and pMOS regions of the RTA sample present 84% and 68% respectively. However, in the RTNOA, the NMOS and pMOS regions present 85% and 72% respectively, a fact that demonstrates the superiority of the RTNOA sample.

In addition, the RTNOA sample presents superior gate depletion characteristics, hysteresis curves with small widths, and superior mobility when compared to the RTA sample. Although the RTNOA sample has the disadvantage of larger CET values than the RTA sample, it has some margins in the leakage current, which may allow the CET values to be reduced by optimising the temperature during oxidation.

High dielectric layers formed according to embodiments of the present invention and used as gate insulating layers exhibit superior mobility and interfacial characteristics. The high dielectric layers formed according to embodiments of the present invention may also be used as capacitor insulating layers of a semiconductor device, as insulating layers between a floating gate and a control gate of a volatile device, as well as a gate insulating layer of a semiconductor device.

Having thus described certain embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A method for treating a high dielectric layer of a semiconductor device, comprising:
   nitriding a high dielectric layer on a silicon substrate, wherein said high dielectric layer comprises a multi-layered nano laminate formed by forming a hafnium oxide layer or a zirconium oxide layer directly on the substrate using atomic layer deposition and then forming a Group 3 metal oxide layer thereon using atomic layer deposition; and
   post treating the high dielectric layer and silicon substrate.

2. The method of claim 1, wherein nitriding a high dielectric layer comprises nitriding said high dielectric layer using a nitriding process selected from the group consisting of a nitrogen plasma treatment process, a thermal treatment process in a nitrogen atmosphere, and a thermal treatment process comprising thermally treating the high dielectric layer after forming a nitrogen layer on the high dielectric layer.

3. The method of claim 1, wherein post treating the high dielectric layer and silicon substrate comprises post treating using a process selected from the group consisting of an oxidation process and an annealing process.

4. The method of claim 1, wherein the Group 3 metal oxide layer is selected from the group consisting of aluminum oxide and yttrium oxide.

5. The method of claims 1, further comprising depositing an additional layer over the silicon substrate, the additional layer selected from the group consisting of a hafnium silicate layer, a zirconium silicate layer, and an aluminum silicate layer.

6. A method for treating a high dielectric layer of a semiconductor device, comprising:

nitriding a silicon substrate and a high dielectric layer on said silicon substrate, said high dielectric layer comprising a multi-layered nano laminate formed by forming a hafnium oxide layer or a zirconium oxide layer directly on the substrate using atomic layer deposition and then forming a Group 3 metal oxide layer thereon using atomic layer deposition; and then annealing the silicon substrate and high dielectric layer.

7. The method of claim 6, wherein the Group 3 metal oxide layer is selected from the group consisting of an aluminum oxide layer and a yttrium oxide layer.

8. The method of claim 6, wherein the nano laminate is formed by depositing an additional layer selected from the group consisting of a hafnium silicate layer, a zirconium silicate layer, and an aluminum silicate layer.

9. The method of claim 6, wherein said nitriding is performed using a nitriding process selected from the group consisting of a nitrogen plasma treatment process, a thermal treatment in a nitrogen atmosphere process, and a process comprising forming a nitrogen layer over the high dielectric layer and thermally treating the formed nitrogen layer.

10. The method of claim 6, wherein said annealing the silicon substrate and high dielectric layer comprises annealing the silicon substrate and high dielectric layer in an atmosphere selected from the group consisting of an inert gas atmosphere, a heavy hydrogen atmosphere, a hydrogen atmosphere, a mixed nitrogen and hydrogen gas atmosphere, and a vacuum atmosphere.

11. The method of claim 6, wherein said annealing the silicon substrate and high dielectric layer comprises annealing the silicon substrate and high dielectric layer at a temperature at or between about 750° C. and 1100° C.

12. A method for treating a high dielectric layer of a semiconductor device, comprising:

nitriding a silicon substrate and a high dielectric layer on said silicon substrate, said high dielectric layer comprising a multi-layered nano laminate formed by forming a hafnium oxide layer or a zirconium oxide layer directly on the substrate using atomic layer deposition, and then forming a Group 3 metal oxide layer thereon using atomic layer deposition; and then oxidizing the silicon substrate and high dielectric layer.

13. The method of claim 12, wherein the Group 3 metal oxide layer is selected from the group consisting of an aluminum oxide layer and a yttrium oxide layer.

14. The method of claim 12, wherein the multi-layered nano laminate is formed by forming an additional layer comprising a hafnium silicate layer, a zirconium silicate layer, or an aluminum silicate layer.

15. The method of claim 12, wherein said nitriding is performed using a nitriding process selected from the group consisting of a nitrogen plasma treatment process, a thermal treatment in a nitrogen atmosphere process, and a process comprising forming a nitrogen layer over the high dielectric layer and thermally treating the formed nitrogen layer.

16. The method of claim 12, wherein said oxidizing the silicon substrate and high dielectric layer comprises wet oxidizing the silicon substrate and high dielectric layer.

17. The method of claim 12, wherein said oxidizing the silicon substrate and high dielectric layer comprises dry oxidizing the silicon substrate and high dielectric layer.

18. The method of claim 12, wherein said oxidizing the silicon substrate and high dielectric layer comprises oxidizing the silicon substrate and high dielectric layer with an oxidizing agent selected from the group consisting of ozone, radical oxygen, and oxygen plasma.

19. A method for treating a high dielectric layer of a semiconductor device, comprising:

nitriding a silicon substrate and a high dielectric layer on said silicon substrate, said high dielectric layer comprising a multi-layered nano laminate formed by forming a hafnium oxide layer or a zirconium oxide layer directly on the substrate using atomic layer deposition, and then forming a Group 3 metal oxide layer thereon using atomic layer deposition; and then oxidizing the silicon substrate and high dielectric layer; and annealing the nitrided and oxidized silicon substrate and high dielectric layer.

20. The method of claim 19, wherein the Group 3 metal oxide layer is selected from the group consisting of an aluminum oxide layer and a yttrium oxide layer.

21. The method of claim 19, wherein the multi-layered nano laminate is formed by depositing additional layer comprising a hafnium silicate layer, a zirconium silicate layer, or an aluminum silicate layer.

22. The method of claim 19, wherein said nitriding is performed using a nitriding process selected from the group consisting of a nitrogen plasma treatment process, a thermal treatment in a nitrogen atmosphere process, and a process comprising forming a nitrogen layer over the high dielectric layer and thermally treating the formed nitrogen layer.

23. The method of claim 19, wherein said oxidizing the silicon substrate and high dielectric layer comprises wet oxidizing the silicon substrate and high dielectric layer.

24. The method of claim 19, wherein said oxidizing the silicon substrate and high dielectric layer comprises dry oxidizing the silicon substrate and high dielectric layer.

25. The method of claim 19, wherein said oxidizing the silicon substrate and high dielectric layer comprises oxidizing the silicon substrate and high dielectric layer with an oxidizing agent selected from the group consisting of ozone, radical oxygen, and oxygen plasma.

26. The method of claim 19, wherein said annealing the nitrided and oxidized silicon substrate and high dielectric layer comprises annealing the nitrided and oxidized silicon substrate and high dielectric layer in an atmosphere selected from the group consisting of an inert gas atmosphere, a heavy hydrogen atmosphere, a hydrogen atmosphere, a mixed nitrogen and hydrogen gas atmosphere, and a vacuum atmosphere.

27. The method of claim 19, wherein said annealing the nitrided and oxidized silicon substrate and high dielectric layer comprises annealing the nitrided and oxidized silicon substrate and high dielectric layer at a temperature at or between about 750° C. and 1100° C.

28. The method of claim 19, wherein said oxidizing the silicon substrate and high dielectric layer comprises oxidizing the silicon substrate and high dielectric layer at or between a temperature of about 700° C. to about 900° C.

29. A method for treating a multi-layered nano laminate high dielectric layer of an integrated circuit device, comprising nitriding to provide a nitride profile concentration in the high dielectric layer that is greater adjacent to a polysilicon/high dielectric layer interface than adjacent to a silicon/high dielectric layer interface, wherein the multi-layered nano laminate is formed by forming a hafnium oxide layer or a zirconium oxide layer directly on the substrate using atomic layer deposition, and then forming a Group 3 metal oxide layer thereon using atomic layer deposition.

* * * * *

UNITED STATES PATENT AND TRADEMARK OFFICE
CERTIFICATE OF CORRECTION

| | | |
|---|---|---|
| PATENT NO. | : 6,875,678 B2 | Page 1 of 1 |
| APPLICATION NO. | : 10/650415 | |
| DATED | : April 5, 2005 | |
| INVENTOR(S) | : Jung et al. | |

It is certified that error appears in the above-identified patent and that said Letters Patent is hereby corrected as shown below:

<u>On the Title Page:</u>
Section 22 should read -- Filed: Aug. 28, 2003 --

Signed and Sealed this

Thirty-first Day of October, 2006

JON W. DUDAS
*Director of the United States Patent and Trademark Office*